(12) United States Patent
Kishimoto et al.

(10) Patent No.: US 10,715,105 B2
(45) Date of Patent: Jul. 14, 2020

(54) ACOUSTIC WAVE DEVICE

(71) Applicant: Murata Manufacturing Co., Ltd., Nagaokakyo-shi, Kyoto-fu (JP)

(72) Inventors: Yutaka Kishimoto, Nagaokakyo (JP); Masashi Omura, Nagaokakyo (JP); Tetsuya Kimura, Nagaokakyo (JP)

(73) Assignee: MURATA MANUFACTURING CO., LTD., Kyoto (JP)

( * ) Notice: Subject to any disclaimer, the term of this patent is extended or adjusted under 35 U.S.C. 154(b) by 373 days.

(21) Appl. No.: 15/604,737

(22) Filed: May 25, 2017

(65) Prior Publication Data
US 2017/0373663 A1 Dec. 28, 2017

(30) Foreign Application Priority Data

Jun. 24, 2016 (JP) .................................. 2016-125728
Mar. 16, 2017 (JP) .................................. 2017-051444

(51) Int. Cl.
*H03H 9/02* (2006.01)
*H03H 9/17* (2006.01)

(52) U.S. Cl.
CPC ........ *H03H 9/175* (2013.01); *H03H 9/02228* (2013.01); *H03H 2250/00* (2013.01)

(58) Field of Classification Search
CPC . H03H 9/175; H03H 9/02228; H03H 9/02535
USPC ...... 310/313 R, 313 A, 313 B, 313 C, 313 D
See application file for complete search history.

(56) References Cited

U.S. PATENT DOCUMENTS

| 2004/0041496 A1* | 3/2004 | Imai ......................... H03H 3/10 |
| | | 310/313 D |
| 2011/0109196 A1 | 5/2011 | Goto et al. |
| 2012/0200371 A1* | 8/2012 | Yamashita ............... H03H 3/08 |
| | | 333/133 |
| 2013/0271238 A1 | 10/2013 | Onda et al. |
| 2013/0285768 A1 | 10/2013 | Watanabe et al. |

FOREIGN PATENT DOCUMENTS

| JP | 05-304436 A | 11/1993 |
| JP | 2012-169707 A | 9/2012 |
| JP | 2013-223025 A | 10/2013 |
| JP | 2015-073331 A | 4/2015 |

(Continued)

OTHER PUBLICATIONS

Official Communication issued in Japanese Patent Application No. 2017-051444, dated Jun. 4, 2019.

*Primary Examiner* — Derek J Rosenau
(74) *Attorney, Agent, or Firm* — Keating & Bennett, LLP

(57) ABSTRACT

An acoustic wave device includes a support substrate, a piezoelectric laminate, and first and second interdigital transducer electrodes. The piezoelectric laminate includes an intermediate layer provided directly or indirectly on the support substrate and a piezoelectric thin film provided on the intermediate layer. The first and second interdigital transducer electrodes are provided on the piezoelectric thin film of the piezoelectric laminate so as to be disposed in an identical or substantially identical plane. In the piezoelectric laminate, a thickness of a portion where the first interdigital transducer electrode is provided is different from a thickness of a portion where the second interdigital transducer electrode is provided.

20 Claims, 9 Drawing Sheets

(56) References Cited

FOREIGN PATENT DOCUMENTS

| JP | 2016-072808 A | 5/2016 |
|----|---------------|--------|
| WO | 2010/004741 A1 | 1/2010 |
| WO | 2016/047255 A1 | 3/2016 |

* cited by examiner

ACOUSTIC WAVE DEVICE

CROSS REFERENCE TO RELATED APPLICATIONS

This application claims the benefit of priority to Japanese Patent Application No. 2016-125728 filed on Jun. 24, 2016 and Japanese Patent Application No. 2017-051444 filed on Mar. 16, 2017. The entire contents of each application are hereby incorporated herein by reference.

BACKGROUND OF THE INVENTION

1. Field of the Invention

The present invention relates to an acoustic wave device that includes a plurality of acoustic wave filters including different pass bands.

2. Description of the Related Art

Nowadays, acoustic wave devices are widely used for, for example, cellular phones. An acoustic wave device described in Japanese Unexamined Patent Application Publication No. 2012-169707 includes a piezoelectric substrate having a stepped interdigital transducer (IDT) electrode formation surface. This acoustic wave device includes an IDT electrode provided in a portion of an IDT electrode formation surface in a thick portion of the piezoelectric substrate and another IDT electrode provided in a portion of the IDT electrode formation surface, at a different level from the level of the thick portion, in a thin portion of the piezoelectric substrate. Thus, a plurality of acoustic wave filters, the electromechanical coupling coefficients of which are different from one another, are configured in the same chip. Here, being configured "in the same chip" means that elements are configured in the same piezoelectric substrate.

With the acoustic wave device described in Japanese Unexamined Patent Application Publication No. 2012-169707, for example, when the IDT electrodes are formed at a time by photolithography in the thick portion of the piezoelectric substrate and the thin portion of the piezoelectric substrate at a different level from the level of the thick portion, light exposure tends to non-uniformly performed due to the difference in level. For this reason, the IDT electrode provided in the thick portion of the piezoelectric substrate and the IDT electrode provided in the thin portion of the piezoelectric substrate at the different level from the level of the thick portion are not necessarily homogeneous.

Accordingly, in order to form homogeneous IDT electrodes in the thick portion of the piezoelectric substrate and the thin portion of the piezoelectric substrate at a different level from the level of the thick portion, it is required that the individual IDT electrodes be formed in respective separate steps at different times instead of at a time. This makes a fabricating process complex. Also in the case where a plurality of acoustic wave filters the pass bands of which are different from one another are fabricated in the same chip, a fabricating process is complex as is the case with the acoustic wave device of Japanese Unexamined Patent Application Publication No. 2012-169707.

SUMMARY OF THE INVENTION

Preferred embodiments of the present invention provide acoustic wave devices in which a plurality of acoustic wave filters with different pass bands from each other are easily fabricated in the same chip.

According to an aspect of an acoustic wave device of a preferred embodiment of the present invention, the acoustic wave device includes a support substrate, a piezoelectric laminate, a first exciting electrode, and a second exciting electrode. The piezoelectric laminate includes an intermediate layer provided directly or indirectly on the support substrate and a piezoelectric thin film provided on the intermediate layer. The first exciting electrode and the second exciting electrode are provided on the piezoelectric thin film of the piezoelectric laminate so as to be disposed in an identical or substantially identical plane. In the piezoelectric laminate, a thickness of a portion where the first exciting electrode is provided is different from a thickness of a portion where the second exciting electrode is provided.

According to a particular aspect of an acoustic wave device of a preferred embodiment of the present invention, in the piezoelectric thin film of the piezoelectric laminate, a thickness of a portion where the first exciting electrode is provided is different from a thickness of a portion where the second exciting electrode is provided.

According to another particular aspect of an acoustic wave device of a preferred embodiments of the present invention, in the intermediate layer of the piezoelectric laminate, a thickness of a portion corresponding to the first exciting electrode is different from a thickness of a portion corresponding to the second exciting electrode.

According to another aspect of an acoustic wave device of a preferred embodiment of the present invention, the acoustic wave device includes a support substrate, a piezoelectric laminate, a first exciting electrode, and a second exciting electrode. The piezoelectric laminate includes an intermediate layer provided directly or indirectly on the support substrate and a piezoelectric thin film provided on the intermediate layer. The first exciting electrode and the second exciting electrode are provided on the piezoelectric thin film of the piezoelectric laminate so as to be disposed in an identical or substantially identical plane. In the piezoelectric laminate, a thickness of a portion where the first exciting electrode is provided is identical to a thickness of a portion where the second exciting electrode is provided. In the piezoelectric thin film, a thickness of a portion where the first exciting electrode is provided is different from a thickness of a portion where the second exciting electrode is provided. In the intermediate layer, a thickness of a portion corresponding to the first exciting electrode is different from a thickness of a portion corresponding to the second exciting electrode.

According to yet another particular aspect of an acoustic wave device of a preferred embodiment of the present invention, the intermediate layer includes a low acoustic velocity film which is provided on a surface of the piezoelectric thin film on an opposite side to a first exciting electrode side and a second exciting electrode side and through which a bulk wave propagates at a lower acoustic velocity than an acoustic velocity at which an elastic wave propagates through the piezoelectric thin film. The support substrate is a high acoustic velocity substrate through which the bulk wave propagates at a higher acoustic velocity than the acoustic velocity at which the elastic wave propagates through the piezoelectric thin film. The support substrate is provided on the low acoustic velocity film. In this case, energy of the elastic wave is able to be effectively confined.

According to yet another particular aspect of an acoustic wave device of a preferred embodiment of the present invention, the intermediate layer includes a low acoustic velocity film and a high acoustic velocity film. The low acoustic velocity film is provided on a surface of the piezoelectric thin film on an opposite side to a first exciting electrode side and a second exciting electrode side and through which a bulk wave propagates at a lower acoustic velocity than an acoustic velocity at which an elastic wave propagates through the piezoelectric thin film. The high acoustic velocity film is provided on the low acoustic velocity film and through which the bulk wave propagates at a higher acoustic velocity than the acoustic velocity at which the elastic wave propagates through the piezoelectric thin film. In this case, energy of the elastic wave is able to be effectively confined.

According to yet another particular aspect of an acoustic wave device of a preferred embodiment of the present invention, the intermediate layer is an acoustic reflection layer that includes at least one low acoustic impedance sublayer and at least one high acoustic impedance sublayer. An acoustic impedance of the at least one low acoustic impedance sublayer is comparatively low. An acoustic impedance of the at least one high acoustic impedance sublayer is comparatively high. In this case, energy of the elastic wave is able to be effectively confined.

According to yet another particular aspect of an acoustic wave device of a preferred embodiment of the present invention, the acoustic reflection layer includes two or more laminated sublayers. In this case, preferable reflection performance of the acoustic reflection layer is able to be obtained, and accordingly, the characteristics of the elastic wave is able to be changed by only changing the thickness of the piezoelectric laminate. That is, the characteristics of the acoustic wave device are able to be easily adjusted.

According to yet another particular aspect of an acoustic wave device of a preferred embodiment of the present invention, the acoustic wave device further includes a support layer that is provided on the support substrate and that includes a portion provided between the support substrate and the intermediate layer.

According to yet another particular aspect of an acoustic wave device of a preferred embodiment of the present invention, the support layer surrounds the piezoelectric thin film in plan view. In this case, when performing cutting with a dicing saw in a fabricating step, undesirable cracks and the like are unlikely to occur in the piezoelectric thin film, and the piezoelectric thin film and the intermediate layer are unlikely to separate from each other.

According to yet another particular aspect of an acoustic wave device of a preferred embodiment of the present invention, the first exciting electrode and the second exciting electrode are a first interdigital transducer electrode and a second interdigital transducer electrode, respectively.

According to various preferred embodiments of the present invention, acoustic wave devices are provided in which the plurality of acoustic wave filters with different pass bands from each other are easily fabricated in a same chip.

The above and other elements, features, steps, characteristics and advantages of the present invention will become more apparent from the following detailed description of the preferred embodiments with reference to the attached drawings.

DETAILED DESCRIPTION OF THE PREFERRED EMBODIMENTS

Specific preferred embodiments of the present invention will be described below with reference to the drawings so as to clarify the present invention.

It is noted that the preferred embodiments described herein are exemplary, and elements are partially exchangeable and combinable between different preferred embodiments.

Figure 1:
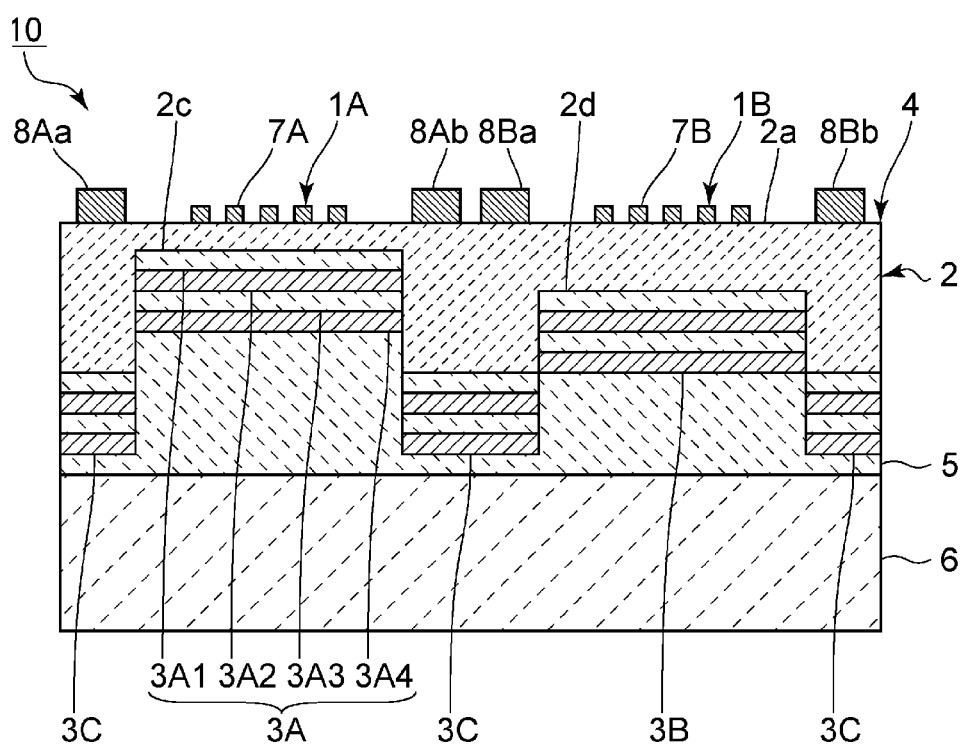
FIG. 1 is a front sectional view of an acoustic wave device according to a first preferred embodiment of the present invention.

FIG. 1 is a front sectional view of an acoustic wave device according to a first preferred embodiment of the present invention.

An acoustic wave device 10 according to a preferred embodiment of the present invention includes a first and second acoustic wave filters 1A and 1B. The pass band of the first and second acoustic wave filters 1A and 1B are different from each other. The first and second acoustic wave filters 1A and 1B are preferably provided and configured in the same chip. Herein, being configured "in the same chip" means that elements are provided and configured in the same piezoelectric thin film.

More specifically, the acoustic wave device 10 includes a support substrate 6. Although it is not particularly limited, the support substrate 6 is preferably made of, for example, silicon or the like. A support layer 5 is provided on the support substrate 6. A piezoelectric laminate 4 is provided on the support layer 5. Thus, the piezoelectric laminate 4 is provided indirectly on the support substrate 6 in the acoustic wave device 10.

The piezoelectric laminate 4 includes an intermediate layer provided on the support layer 5 and a piezoelectric thin film 2 provided on the intermediate layer. Although the details thereof will be described later, the intermediate layer preferably includes first to third acoustic reflection layers 3A to 3C according to the present preferred embodiment.

The piezoelectric thin film 2 includes a main surface 2a positioned on the side thereof opposite to the first to third acoustic reflection layers 3A to 3C side. Here, the vertical direction of FIG. 1 is defined as the vertical direction of the acoustic wave device 10. At this time, the piezoelectric thin film 2 includes first and second recesses 2c and 2d provided on the lower surface side. According to the present preferred embodiment, the thickness of the piezoelectric thin film 2 is smaller in a portion of the piezoelectric thin film 2 above the first recess 2c than in a portion of the piezoelectric thin film 2 above the second recess 2d. The piezoelectric thin film 2 is preferably made of a piezoelectric single crystal such as, for example, $LiNbO_3$ or $LiTaO_3$. Despite this, the material of the piezoelectric thin film 2 is not particularly limited. The piezoelectric thin film 2 may alternatively be made of, for example, piezoelectric ceramic or the like.

The thickness of the piezoelectric thin film 2 in the portions above the first and second recesses 2c and 2d is preferably from about 100 nm to about 2000 nm, for example. Despite this, the thickness of the piezoelectric thin film 2 is not particularly limited.

First and second interdigital transducer (IDT) electrodes 7A and 7B defining and functioning first and second exciting electrodes are provided on the main surface 2a of the piezoelectric thin film 2. An elastic wave is excited by applying voltage to the first and second IDT electrodes 7A and 7B. The first IDT electrode 7A defines the pass band of the first acoustic wave filter 1A. The second IDT electrode 7B defines the pass band of the second acoustic wave filter 1B.

Here, various types of elastic waves can be used in the acoustic wave device 10. Examples of the various types of elastic waves include, for example, plate waves and bulk waves. The plate waves generally refer to various waves excited in the piezoelectric thin film 2 preferably having a thickness of about 1λ or smaller when the wavelength of excited plate waves is 1λ, for example. Furthermore, energy of the plate waves concentrates in the piezoelectric thin film 2 or a region near the piezoelectric thin film 2.

Thus, as will be described later, the intermediate layer that reflects the plate waves is provided right below the piezoelectric thin film 2 according to the present preferred embodiment. This allows the excitation of the plate waves.

The first IDT electrode 7A illustrated in FIG. 1 is provided in a portion superposed on the first recess 2c in plan view. The second IDT electrode 7B is provided in a portion superposed on the second recess 2d in plan view. Accordingly, in the piezoelectric thin film 2, the thickness of a portion where the first IDT electrode 7A is provided is different from the thickness of a portion where the second IDT electrode 7B is provided.

Wiring lines 8Aa and 8Ab electrically connected to the first IDT electrode 7A are provided on the main surface 2a of the piezoelectric thin film 2. Wiring lines 8Ba and 8Bb electrically connected to the second IDT electrode 7B are also provided on the main surface 2a. The first and second IDT electrodes 7A and 7B and the wiring lines 8Aa, 8Ab, 8Ba, and 8Bb are provided in the same plane. Herein, "the same plane" refers to the same plane or different planes that are the same or substantially the same to the degree of not affecting the characteristics of the acoustic wave device.

The first and second IDT electrodes 7A and 7B are each preferably made of a laminated metal film. The laminated metal film is made of a laminate of a Ti layer and an AlCu layer that contains about 99 weight % Al and about 1 weight % Cu. The Ti layer is laminated on the main surface 2a of the piezoelectric thin film 2, and the AlCu layer is laminated on the Ti layer. The first and second IDT electrodes 7A and 7B may include a single layer structure or a laminated metal film. The material of the first and second IDT electrodes 7A and 7B is not particularly limited.

The wiring lines 8Aa, 8Ab, 8Ba, and 8Bb are each preferably made of a laminated metal film defined by a laminate of a Ti layer and an Al layer. The Ti layer is laminated on the main surface 2a of the piezoelectric thin film 2, and the Al layer is laminated on the Ti layer. The wiring lines 8Aa, 8Ab, 8Ba, and 8Bb may include a single layer structure or a laminated metal film. The material of the wiring lines 8Aa, 8Ab, 8Ba, and 8Bb are not particularly limited.

The thickness of the first and second IDT electrodes 7A and 7B according to the present preferred embodiment is preferably from about 10 nm to about 1000 nm, for example. The thickness of the wiring lines 8Aa, 8Ab, 8Ba, and 8Bb is preferably from about 100 nm to about 1000 nm, for example. The thicknesses of the first and second IDT electrodes 7A and 7B and the wiring lines 8Aa, 8Ab, 8Ba, and 8Bb are not particularly limited.

The first to third acoustic reflection layers 3A to 3C are preferably provided on the side of the piezoelectric thin film 2 opposite to the main surface 2a. Here, a plurality of the third acoustic reflection layers 3C are provided. More specifically, the first acoustic reflection layer 3A is provided in the first recess 2c of the piezoelectric thin film 2. The second acoustic reflection layer 3B is provided in the second recess 2d. The plurality of third acoustic reflection layers 3C are provided in respective portions other than the first and second recesses 2c and 2d. The first and second acoustic reflection layers 3A and 3B may extend to the outside of the first and second recesses 2c and 2d and may be continuous with the third acoustic reflection layers 3C. According to the present preferred embodiment, the thicknesses of the first to third acoustic reflection layers 3A to 3C are the same. Herein, "thicknesses . . . are the same" refers to the same thickness or thicknesses that are substantially the same to the degree of not affecting the characteristics of the acoustic wave device.

As described above, in the piezoelectric thin film 2, the thickness of the portion where the first IDT electrode 7A is provided is different from the thickness of the portion where the second IDT electrode 7B is provided. Accordingly, also in the piezoelectric laminate 4 that includes the piezoelectric thin film 2 and the first to third acoustic reflection layers 3A to 3C, the thickness of a portion where the first IDT electrode 7A is provided is different from the thickness of a portion where the second IDT electrode 7B is provided.

As illustrated in FIG. 1, the first acoustic reflection layer 3A is preferably a laminated film that includes low acoustic impedance sublayers 3A1 and 3A3 and high acoustic impedance sublayers 3A2 and 3A4. The low acoustic impedance sublayers 3A1 and 3A3 and the high acoustic impedance sublayers 3A2 and 3A4 are laminated in an alternating sequence, and out of these sublayers, the low acoustic impedance sublayer 3A1 is closest to the piezoelectric thin film 2. The acoustic impedances of the low acoustic impedance sublayers 3A1 and 3A3 are comparatively low. The acoustic impedances of the high acoustic impedance sublayers 3A2 and 3A4 are comparatively high.

The first acoustic reflection layer 3A reflects toward the piezoelectric thin film 2 side an elastic wave having propagated from the piezoelectric thin film 2. This allows energy of the elastic wave to be confined on the piezoelectric thin film 2 side, thus improving energy efficiency.

The low acoustic impedance sublayers 3A1 and 3A3 are preferably made of, for example, silicon oxide, which has a comparatively low acoustic impedance. Alternatively, the low acoustic impedance sublayers 3A1 and 3A3 may be made of a material containing silicon oxide as its main component or made of a dielectric material other than silicon oxide or a metal material. The high acoustic impedance sublayers 3A2 and 3A4 are preferably made of, for example, Pt, another dielectric material, or a metal material which have a comparatively high acoustic impedance. The high acoustic impedance sublayers 3A2 and 3A4 may alternatively be made of metal other than Pt, for example, Mo, Ta, or W. The high acoustic impedance sublayers 3A2 and 3A4 also are not necessarily a metal layer. Instead, the high acoustic impedance sublayers 3A2 and 3A4 may be made of ceramic such as AlN or SiN or a piezoelectric single crystal such as, for example, $LiNbO_3$ or $LiTaO_3$. Neither the material of the low acoustic impedance sublayers 3A1 and 3A3 nor the material of the high acoustic impedance sublayers 3A2 and 3A4 is particularly limited. It is sufficient that the low acoustic impedance sublayers 3A1 and 3A3 and the high acoustic impedance sublayers 3A2 and 3A4 be made of materials having acoustic impedances different from each other.

Although it is not particularly limited, four sublayers are preferably laminated in the first acoustic reflection layer 3A according to the present preferred embodiment, for example. The second and third acoustic reflection layers 3B and 3C are preferably configured similarly to or in the same manner as the first acoustic reflection layer 3A. The third acoustic reflection layers 3C are not necessarily provided.

According to the present preferred embodiment, the thickness of each of the low acoustic impedance sublayers 3A1 and 3A3 and the high acoustic impedance sublayers 3A2 and 3A4 is preferably from about 100 nm to about 1000 nm, for example. However, the thickness of each of the low acoustic impedance sublayers 3A1 and 3A3 and the high acoustic impedance sublayers 3A2 and 3A4 is not limited to the above-described range.

The support layer 5 is disposed on the side of the first to third acoustic reflection layers 3A to 3C opposite to the piezoelectric thin film 2 side. A surface of the support layer 5 on the first to third acoustic reflection layers 3A to 3C side has irregularities. These irregularities correspond to irregularities on the surface of the piezoelectric thin film 2 on the first to third acoustic reflection layers 3A to 3C side. In contrast, a surface of the support layer 5 on the side thereof opposite to the first to third acoustic reflection layers 3A to 3C side is preferably flat or substantially flat. That is, the support layer 5 adjusts the variation of the thickness between a portion of the piezoelectric thin film 2 corresponding to the first IDT electrode 7A and a portion of the piezoelectric thin film 2 corresponding to the second IDT electrode 7B. In contrast, since the intermediate layer affects the filter characteristics and the like, adjusting the variation of the thickness between the portion of the piezoelectric thin film 2 corresponding to the first IDT electrode 7A and the portion of the piezoelectric thin film 2 corresponding to the second IDT electrode 7B by the intermediate layer may lead to degradation of the filter characteristics and the like. According to the present preferred embodiment, the variation of the thickness of the piezoelectric thin film 2 is adjusted by the support layer 5. This prevents degradation of the resonator characteristics and the filter characteristics.

Although it is not particularly limited, the support layer 5 is preferably made of, for example, silicon oxide or the like.

Here, the present preferred embodiment preferably includes the following configurations: 1) In the piezoelectric laminate 4, the thickness of the portion where the first IDT electrode 7A is provided is different from the thickness of the portion where the second IDT electrode 7B is provided; and 2) the first and second IDT electrodes 7A and 7B are provided in the same plane. Thus, in the same piezoelectric laminate 4, the acoustic velocity between the elastic wave having propagated through the portion where the first IDT electrode 7A is provided and the elastic wave having propagated through the portion where the second IDT electrode 7B is provided are able to be easily varied. Accordingly, the first and second acoustic wave filters 1A and 1B with different pass bands from each other are able to be easily fabricated in the same chip. The details will be described below with a method of fabricating the acoustic wave device 10 according to the present preferred embodiment.

FIGS. 2A to 2D are front sectional views illustrating an example of a method of fabricating the acoustic wave device according to the first preferred embodiment of the present invention. FIGS. 3A to 3C are front sectional views illustrating the example of the method of fabricating the acoustic wave device according to the first preferred embodiment of the present invention.

Figure 2A:
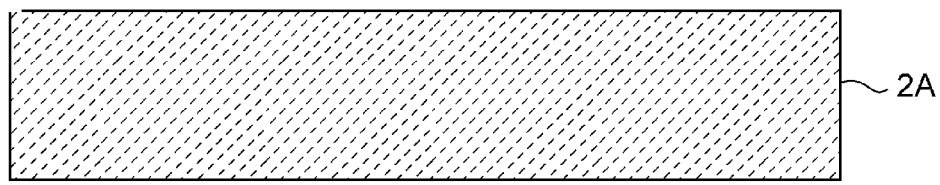
FIGS. 2A to 2D are front sectional views illustrating an example of a method of fabricating the acoustic wave device according to the first preferred embodiment of the present invention.
Figure 2B:
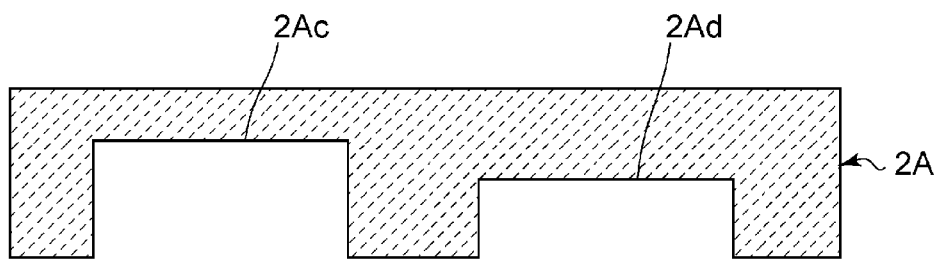
Figure 3A:
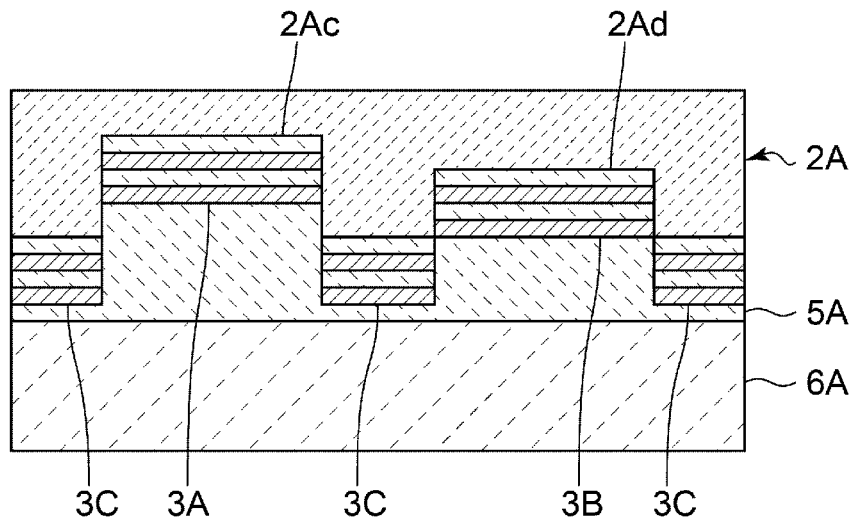
FIGS. 3A to 3C are front sectional views illustrating the example of the method of fabricating the acoustic wave device according to the first preferred embodiment of the present invention.
Figure 3B:
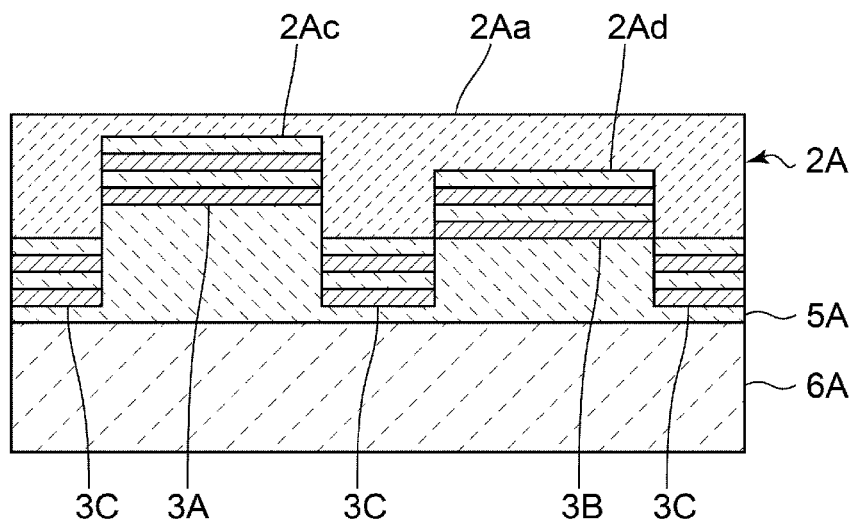
Figure 3C:
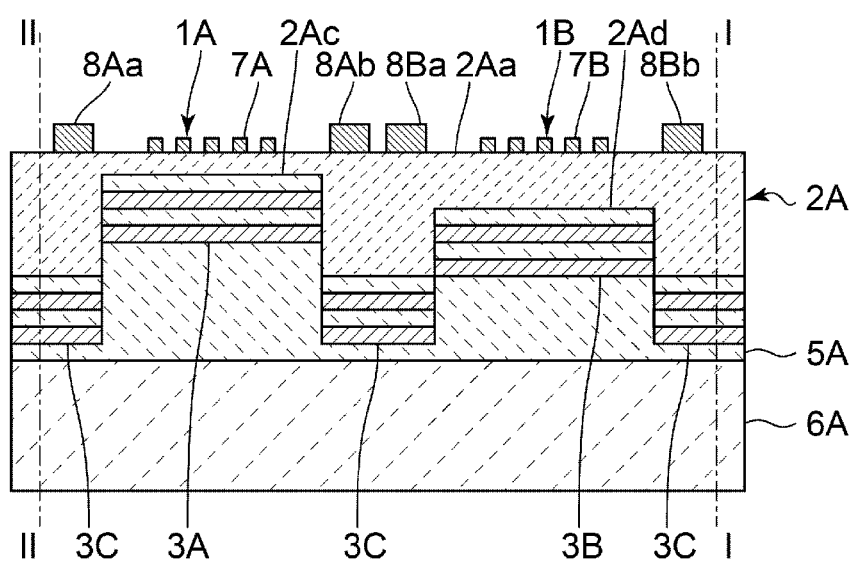

As illustrated in FIG. 2A, a mother substrate 2A made of a piezoelectric material is prepared. Next, as illustrated in FIG. 2B, first and second recesses 2Ac and 2Ad are formed in one main surface of the mother substrate 2A by, for example, reactive ion etching. At this time, the first and second recesses 2Ac and 2Ad are formed such that the depth of the first recess 2Ac is larger than that of the second recess 2Ad. Here, the vertical direction of FIG. 2B is defined as the vertical direction of the mother substrate 2A. With the first and second recesses 2Ac and 2Ad as described above, the thickness of a portion of the mother substrate 2A above the first recess 2Ac is smaller than that of a portion of the mother substrate 2A above the second recess 2Ad.

Figure 2C:
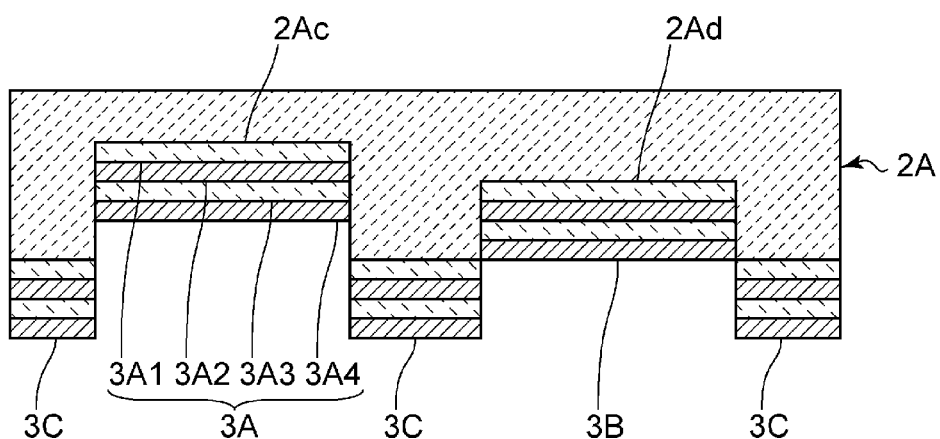

Next, as illustrated in FIG. 2C, a low acoustic impedance sublayer is preferably formed on a side of the mother substrate 2A where the first and second recesses 2Ac and 2Ad are provided. At this time, the low acoustic impedance sublayer 3A1 is formed in the first recess 2Ac. The low acoustic impedance sublayer is also formed in the second recess 2Ad and at portions where neither the first recess 2Ac nor the second recess 2Ad is formed. Next, a high acoustic impedance sublayer is formed on the low acoustic impedance sublayer. The first to third acoustic reflection layers 3A to 3C defining and functioning as the intermediate layer are preferably formed by laminating low acoustic impedance sublayers and high acoustic impedance sublayers in an alternating sequence in the same or similar way. The low acoustic impedance sublayers and the high acoustic impedance sublayers can preferably be formed by, for example, a process such as sputtering or vapor deposition.

Figure 2D:
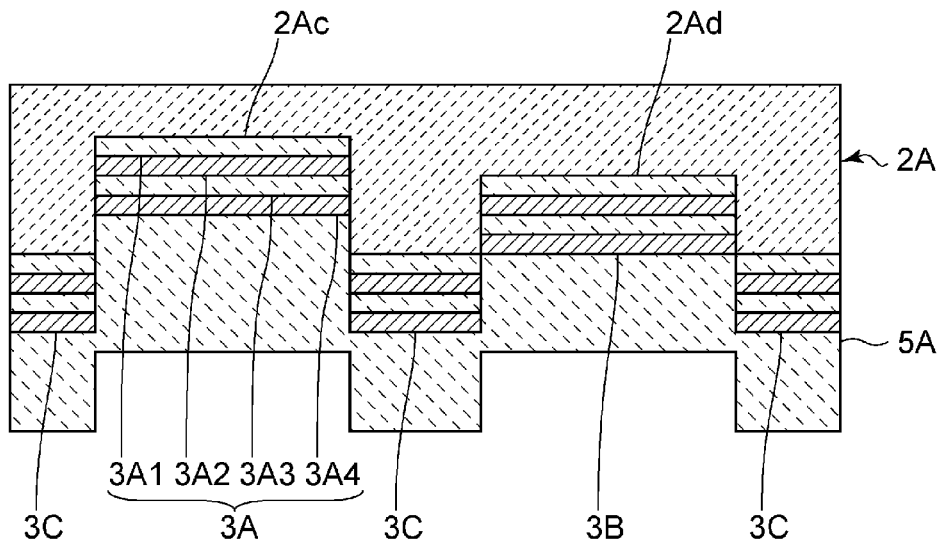

Next, as illustrated in FIG. 2D, a support layer 5A is preferably laminated on the side of the first to third acoustic reflection layers 3A to 3C opposite to the mother substrate 2A side by, for example, a process such as sputtering. Next, as illustrated in FIG. 3A, a surface of the support layer 5A on the opposite side to the first to third acoustic reflection layers 3A to 3C side is planarized by, for example, chemical mechanical polishing (CMP).

Next, a support substrate 6A is joined to the surface of the support layer 5A on the opposite side to the first to third acoustic reflection layers 3A to 3C side. A resin adhesive may be used to join the support layer 5A and the support substrate 6A to each other. However, the method of joining the support layer 5A and the support substrate 6A is not particularly limited. For example, another joining technique such as surface activation joining, atomic diffusion joining, or metal joining may be used.

Next, as illustrated in FIG. 3B, the thickness of the mother substrate 2A is reduced. This makes the mother substrate 2A have a thickness with which the mother substrate 2A can efficiently excite the elastic wave. The thickness of the mother substrate 2A is able to be reduced by, for example, polishing a surface on the side of the mother substrate 2A opposite to the first to third acoustic reflection layers 3A to 3C side. Alternatively, the thickness of the mother substrate 2A may be reduced by a smart-cut process performed by implanting ions into the mother substrate 2A for separation. Thus, a flat main surface 2Aa is formed on the side of the mother substrate 2A opposite to the first to third acoustic reflection layers 3A to 3C.

Next, as illustrated in FIG. 3C, the first and second IDT electrodes 7A and 7B and wiring lines 8Aa, 8Ab, 8Ba, and 8Bb are formed on the main surface 2Aa of the mother substrate 2A. The first IDT electrode 7A is preferably formed in a region where the first acoustic reflection layer 3A is formed in plan view. The second IDT electrode 7B is preferably formed in a region where the second acoustic reflection layer 3B is formed in plan view. The first and second IDT electrodes 7A and 7B and the wiring lines 8Aa, 8Ab, 8Ba, and 8Bb are preferably formed by, for example, a process such as sputtering or vapor deposition. Thus, the first and second acoustic wave filters 1A and 1B are fabricated.

According to the present preferred embodiment, the first and second IDT electrodes 7A and 7B and the wiring lines 8Aa, 8Ab, 8Ba, and 8Bb are able to be formed in the same plane or substantially the same plane. Accordingly, despite variation of the thickness of the mother substrate 2A between the first and second recesses 2Ac and 2Ad, no complex steps are required. As has been described, the first and second acoustic wave filters 1A and 1B with different pass bands from each other are able to be easily fabricated.

Furthermore, according to the present preferred embodiment, the numbers of laminated sublayers of the first to third acoustic reflection layers 3A to 3C preferably are the same, for example. Thus, the first and second acoustic wave filters 1A and 1B are able to be more easily fabricated.

Next, the resulting structure is cut along dicing lines I-I and II-II illustrated in FIG. 3C with a dicing saw. Consequently, a single acoustic wave device 10 illustrated in FIG. 1 can be obtained.

According to the present preferred embodiment, an increase in thickness of portions of the piezoelectric thin film 2 other than the first and second recesses 2c and 2d is unlikely to largely affect excitation efficiency. Furthermore, for example, instead of forming the third acoustic reflection layers 3C, the support layer 5A may be in contact with the mother substrate 2A at portions where the dicing lines I-I and II-II extend. This allows the number of interfaces between thin films at the positions of the dicing lines I-I and II-II to be reduced, and accordingly, the likelihood of occurrences of separation or the like due to dicing is able to be reduced.

Referring back to FIG. 1, the number of laminated sublayers of the first to third acoustic reflection layers 3A to 3C is preferably two or more, for example. In this case, preferable reflection performance of the acoustic reflection layers is able to be obtained and the characteristics of the elastic wave are able to be changed accordingly by only changing the thickness of the piezoelectric laminate 4. That is, the characteristics of the acoustic wave device 10 are able to be easily adjusted.

The first and second recesses 2c and 2d are provided in the piezoelectric thin film 2. It is sufficient that the thickness of the piezoelectric thin film 2 vary between the portion where the first IDT electrode 7A is provided and the portion where the second IDT electrode 7B is provided, and neither of the first and second recesses 2c and 2d is necessarily provided.

Since the acoustic wave device 10 is reinforced by the support substrate 6, the strength of the acoustic wave device 10 is able to be increased. However, it is also possible to omit the support substrate 6 if so desired.

Figure 4:
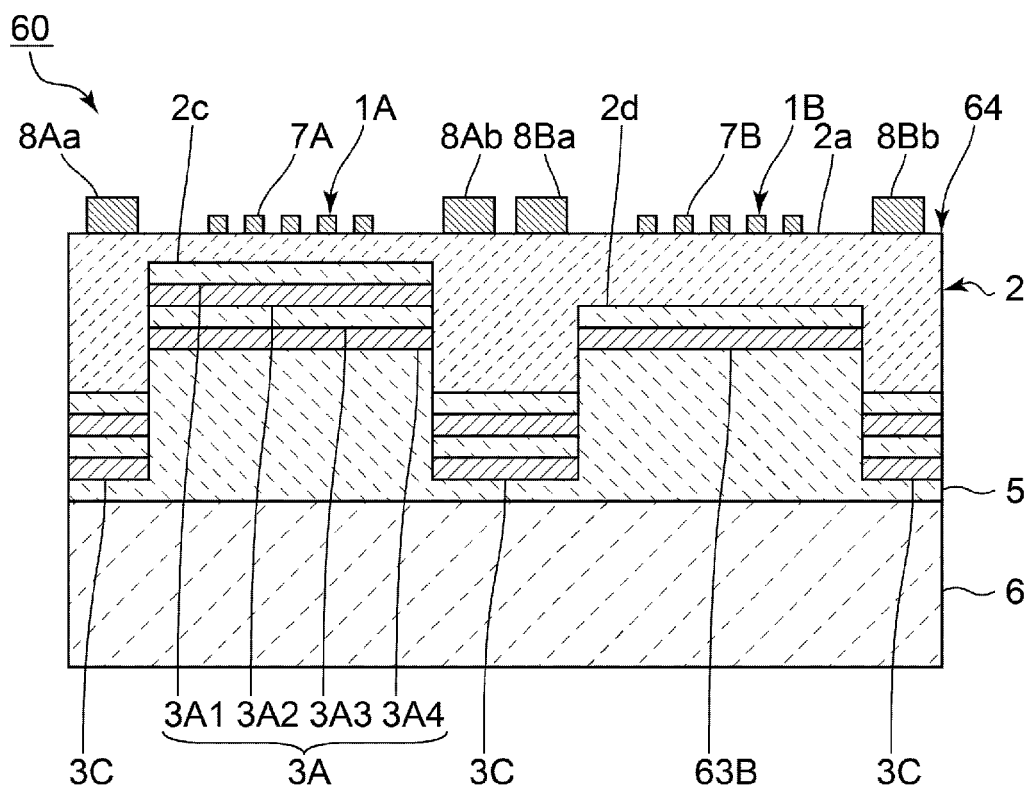
FIG. 4 is a front sectional view of an acoustic wave device according to a variation of the first preferred embodiment of the present invention.

FIG. 4 is a front sectional view of an acoustic wave device according to a variation of the first preferred embodiment.

In an acoustic wave device 60, the thickness of the first acoustic reflection layer 3A and the thickness of a second acoustic reflection layer 63B are different from each other. In addition, in the piezoelectric thin film 2, the thickness of the portion where the first IDT electrode 7A is provided and the thickness of a portion where the second IDT electrode 7B is provided are different from each other. With this configuration, in a piezoelectric laminate 64, the thickness of the portion where the first IDT electrode 7A is provided and the thickness of the portion where the second IDT electrode 7B is provided are the same. Other than the above-described differences, the configuration of the acoustic wave device 60 is preferably the same as or similar to that of the acoustic wave device 10 according to the first preferred embodiment.

The thickness of the first acoustic reflection layer 3A is larger than the thickness of the second acoustic reflection layer 63B. For example, the thickness of the first acoustic reflection layer 3A and the thickness of the second acoustic reflection layer 63B may preferably be made to be different from each other by making the number of the sublayers of the first acoustic reflection layer 3A and the number of sublayers of the second acoustic reflection layer 63B different from each other. According to the present preferred embodiment, the number of sublayers of the first acoustic reflection layer 3A is preferably four and the number of sublayers of the second acoustic reflection layer 63B is preferably two, for example.

According to the variation illustrated in FIG. 4, the numbers of the laminated sublayers of the first and second acoustic reflection layers 3A and 63B and the thicknesses of the first and second acoustic reflection layers 3A and 63B are able to be significantly improved in the portions of the piezoelectric thin film 2 where the first IDT electrode 7A and the second IDT electrode 7B are provided. Accordingly, the filter characteristics of the first and second acoustic wave filters 1A and 1B are able to be effectively improved.

Furthermore, as is the case with the first preferred embodiment, the first and second acoustic wave filters 1A and 1B with different pass bands from each other are able to be easily fabricated in the same chip.

Figure 5:
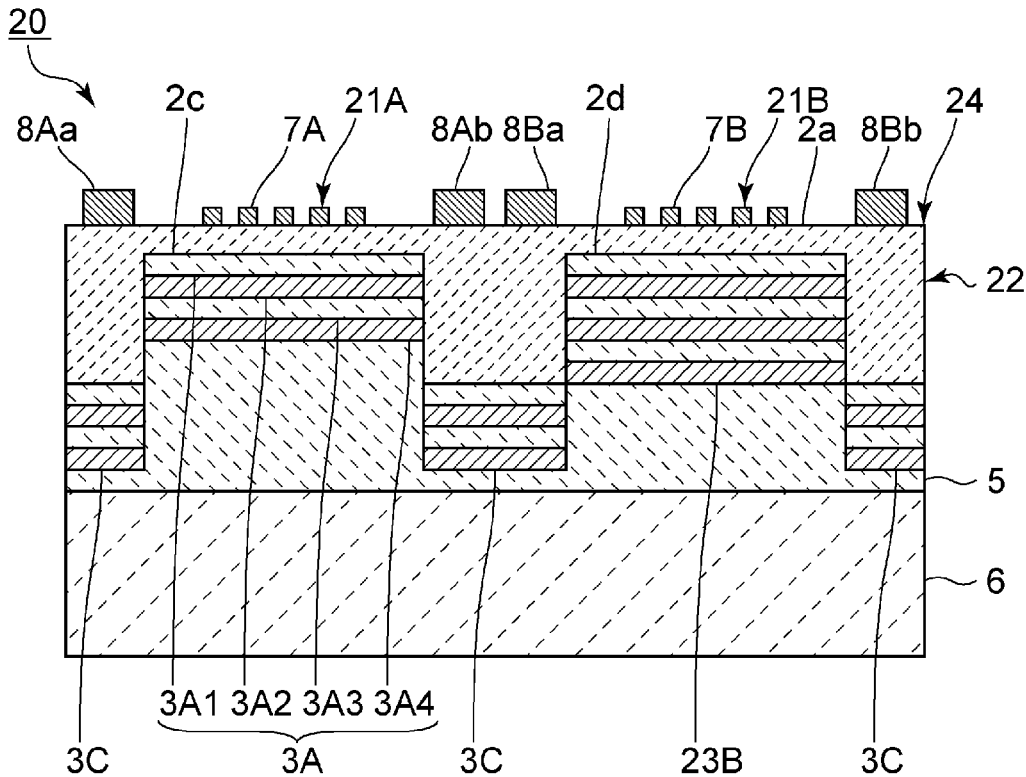
FIG. 5 is a front sectional view of an acoustic wave device according to a second preferred embodiment of the present invention.

FIG. 5 is a front sectional view of an acoustic wave device according to a second preferred embodiment of the present invention.

An acoustic wave device 20 is different from the acoustic wave device 10 according to the first preferred embodiment in the following points. That is, in a piezoelectric thin film 22, the thickness of a portion where the first IDT electrode 7A is provided and the thickness of a portion where the second IDT electrode 7B is provided are preferably the same or substantially the same. The acoustic wave device 20 is different from the acoustic wave device 10 according to the first preferred embodiment also in the following point. That is, the thickness of the first acoustic reflection layer 3A is different from the thickness of a second acoustic reflection layer 23B. Other than the above-described points, the configuration of the acoustic wave device 20 is preferably the same as or similar to that of the acoustic wave device 10 according to the first preferred embodiment.

The thickness of the second acoustic reflection layer 23B is larger than the thickness of the first acoustic reflection layer 3A. As is the case with the variation of the first preferred embodiment illustrated in FIG. 4, for example, the thickness of the first acoustic reflection layer 3A and the thickness of the second acoustic reflection layer 23B may be made to be different from each other by making the number of sublayers of the first acoustic reflection layer 3A and the number of sublayers of the second acoustic reflection layer 23B different from each other. According to the present preferred embodiment, the number of laminated sublayers of the first acoustic reflection layer 3A is preferably four and the number of laminated sublayers of the second acoustic reflection layer 23B is preferably six, for example. The thicknesses of portions of a piezoelectric laminate 24 where the first IDT electrode 7A is provided and where the second IDT electrode 7B is provided may be made to be different from each other by making the thickness of the first acoustic reflection layer 3A and the thickness of the second acoustic reflection layer 23B defining and functioning the intermediate layer different from each other as described above.

Here, a plurality of acoustic wave filters are fabricated. Other than making the numbers of laminated sublayers of the acoustic reflection layers different from each other and making the thicknesses of the acoustic reflection layers different from each other, these acoustic wave filters preferably have the same or similar configuration. The impedance characteristics and return losses of these acoustic wave filters are compared. The comparison is made between an acoustic wave filter including four laminated acoustic reflection sublayers and an acoustic wave filter including six laminated acoustic reflection sublayers.

Figure 6:
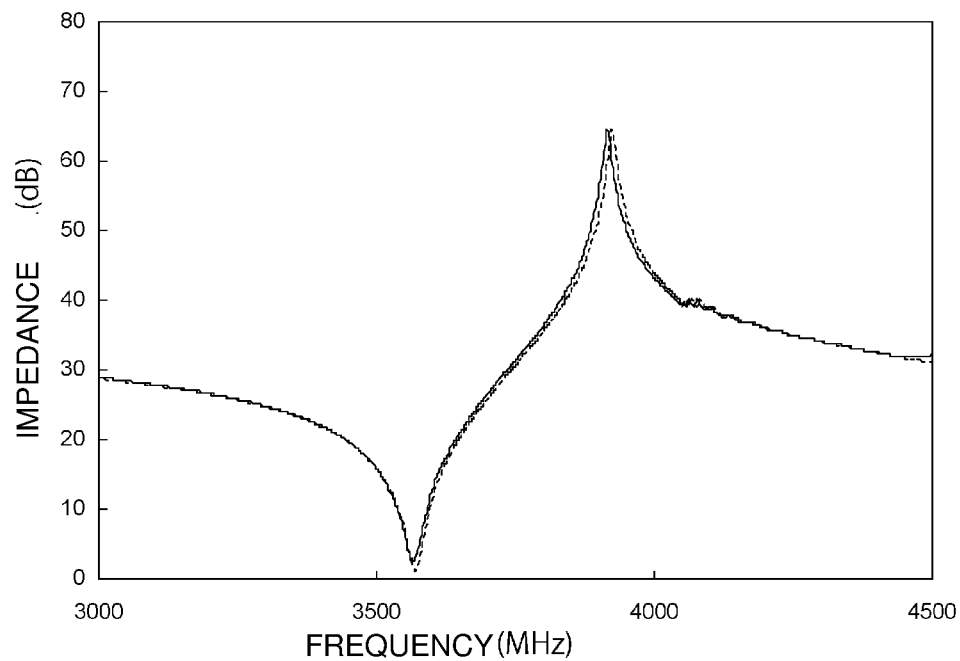
FIG. 6 illustrates the impedance characteristics of an acoustic wave filter including four laminated acoustic reflection sublayers and an acoustic wave filter including six laminated acoustic reflection sublayers.
Figure 7:
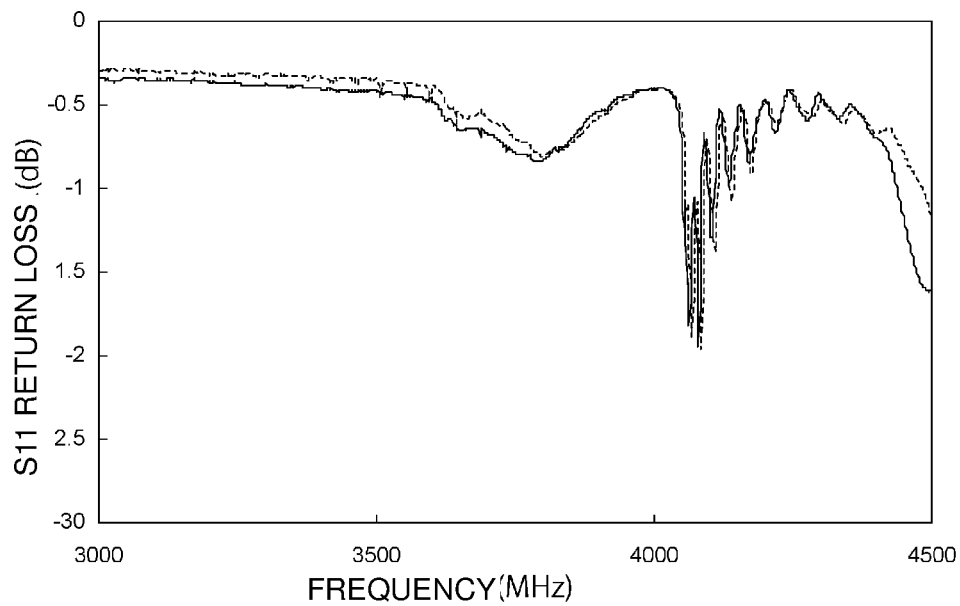
FIG. 7 illustrates an S11 return loss of the acoustic wave filter including four laminated acoustic reflection sublayers and the acoustic wave filter including six laminated acoustic reflection sublayers.

FIG. 6 illustrates the impedance characteristics of the acoustic wave filter including four laminated acoustic reflection sublayers and the acoustic wave filter including six laminated acoustic reflection sublayers. FIG. 7 illustrates an S11 return loss of the acoustic wave filter including four laminated acoustic reflection sublayers and the acoustic wave filter including six laminated acoustic reflection sublayers. In FIGS. 6 and 7, solid lines indicate results with the acoustic wave filter including six laminated acoustic reflection sublayers and broken lines indicate results with the acoustic wave filter including four laminated acoustic reflection sublayers.

As illustrated in FIGS. 6 and 7, even when the thickness of the piezoelectric thin film is uniform, the impedance characteristics and the returns losses are able to be changed by varying the thickness of the acoustic reflection layers. Here, it is assumed that the wavelength of the elastic wave in use is represented by λ. For example, when the thickness of the piezoelectric thin film is 1λ and a particular frequency of the pass band is 1 GHz, the particular frequency of the pass band can be 2 GHz by setting the thickness of the piezoelectric thin film to 0.5λ. In contrast, even when the thickness of the piezoelectric thin film is fixed to 1λ, the particular frequency of the pass band is able to be shifted from 1 GHz by varying the thickness of the acoustic reflection film, for example.

Also according to the present preferred embodiment illustrated in FIG. 5, first and second acoustic wave filters 21A and 21B with different pass bands from each other are able to be easily fabricated in a same chip.

Furthermore, as described above, in the piezoelectric thin film 22, the thickness of the portion where the first IDT electrode 7A is preferably provided and the thickness of the portion where the second IDT electrode 7B is provided are the same. Accordingly, the piezoelectric thin film 22 is able to be easily fabricated.

Figure 8:
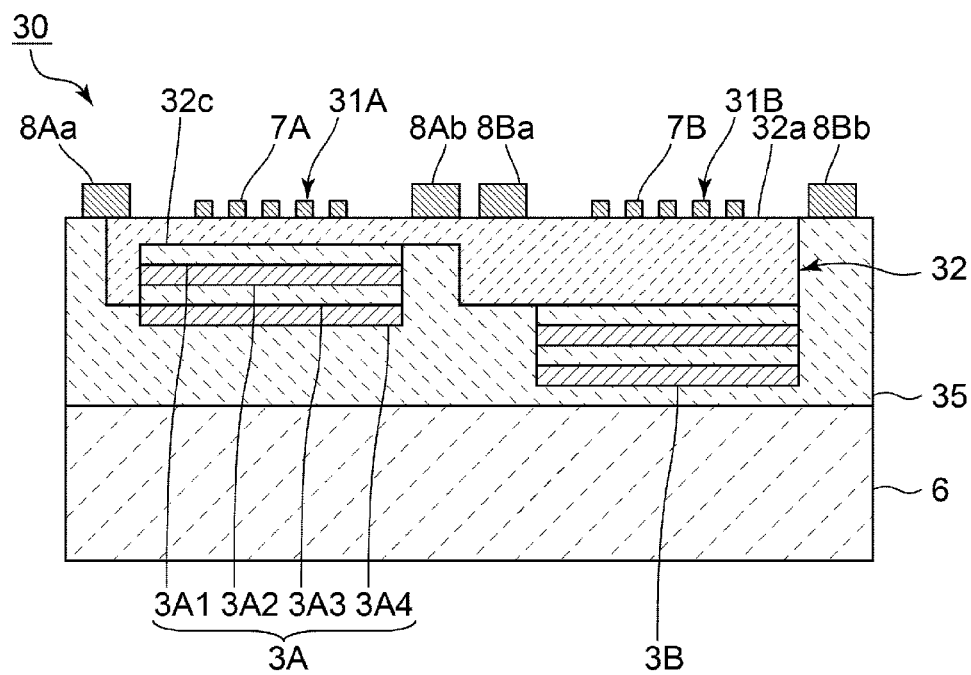
FIG. 8 is a front sectional view of an acoustic wave device according to a third preferred embodiment of the present invention.

FIG. 8 is a front sectional view of an acoustic wave device according to a third preferred embodiment of the present invention.

An acoustic wave device 30 is different from the acoustic wave device 10 according to the first preferred embodiment in the following points. That is, the acoustic wave device 30 includes a piezoelectric thin film 32 and a support layer 35 respectively configured differently from the piezoelectric thin film 2 and the support layer 5, and the acoustic wave device 30 does not include a third acoustic reflection layer. Other than the above-described points, the configuration of the acoustic wave device 30 is preferably the same as or similar to that of the acoustic wave device 10 according to the first preferred embodiment.

More specifically, the support layer 35 includes a portion which is provided between the support substrate 6 and the first and second acoustic reflection layers 3A and 3B defining and functioning the intermediate layer and a portion which is provided between the support substrate 6 and the piezoelectric thin film 32. In addition, the support layer 35 surrounds the piezoelectric thin film 32 in plan view.

The piezoelectric thin film 32 preferably includes a first recess 32c and does not have a second recess. Furthermore, in the piezoelectric thin film 32, the thickness of a portion where the first IDT electrode 7A is provided is different from the thickness of a portion where the second IDT electrode 7B is provided. The first and second IDT electrodes 7A and 7B are provided in the same plane. Accordingly, as is the case with the first preferred embodiment, first and second acoustic wave filters 31A and 31B with different pass bands from each other are able to be easily fabricated in the same chip.

As is the case with the wiring lines 8Aa and 8Bb, the wiring of the present preferred embodiment may include portions provided on the support layer 35.

It is sufficient that the first acoustic reflection layer 3A be superposed on the first IDT electrode 7A in plan view. The first acoustic reflection layer 3A may be provided in a portion of the first recess 32c. As is the case with the present preferred embodiment, the second acoustic reflection layer 3B may be disposed in a portion other than a recess of the piezoelectric thin film 32.

When performing cutting on the acoustic wave device 30 with a dicing saw in a fabricating step, undesirable cracks and the like are unlikely to occur in the piezoelectric thin film 32, and the piezoelectric thin film 32 and the first and second acoustic reflection layers 3A and 3B are unlikely to separate from one another. This and a method of fabricating the acoustic wave device 30 will be described below.

FIGS. 9A to 9D are front sectional views illustrating an example of the method of fabricating the acoustic wave device according to the third preferred embodiment. FIGS. 10A to 10C are front sectional views illustrating the example of the method of fabricating the acoustic wave device according to the third preferred embodiment.

Figure 9A:
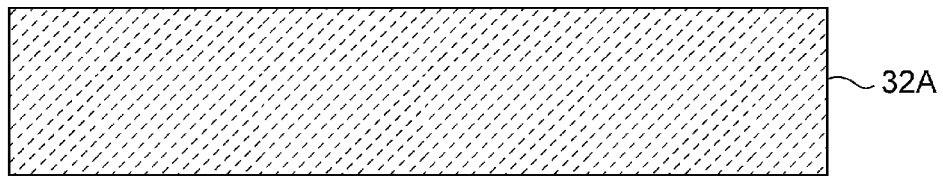
FIGS. 9A to 9D are front sectional views illustrating an example of a method of fabricating the acoustic wave device according to the third preferred embodiment of the present invention.
Figure 9B:
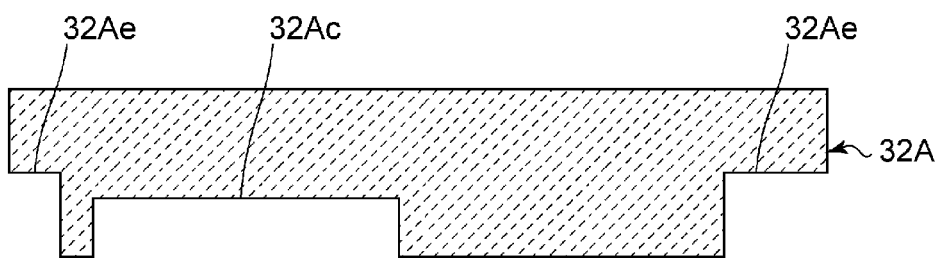
Figure 10A:
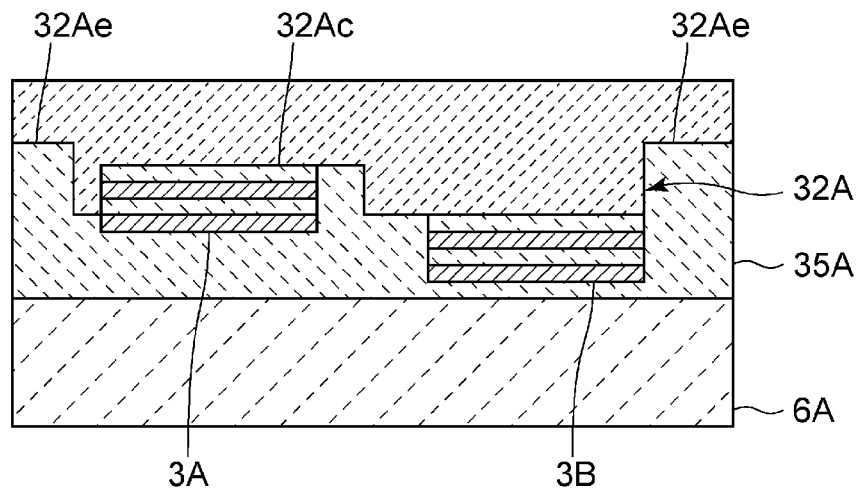
FIGS. 10A to 10C are front sectional views illustrating the example of the method of fabricating the acoustic wave device according to the third preferred embodiment of the present invention.
Figure 10B:
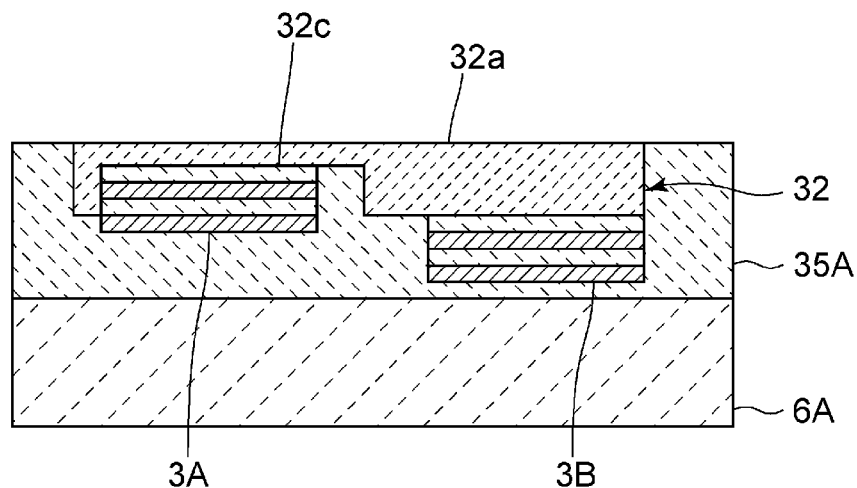
Figure 10C:
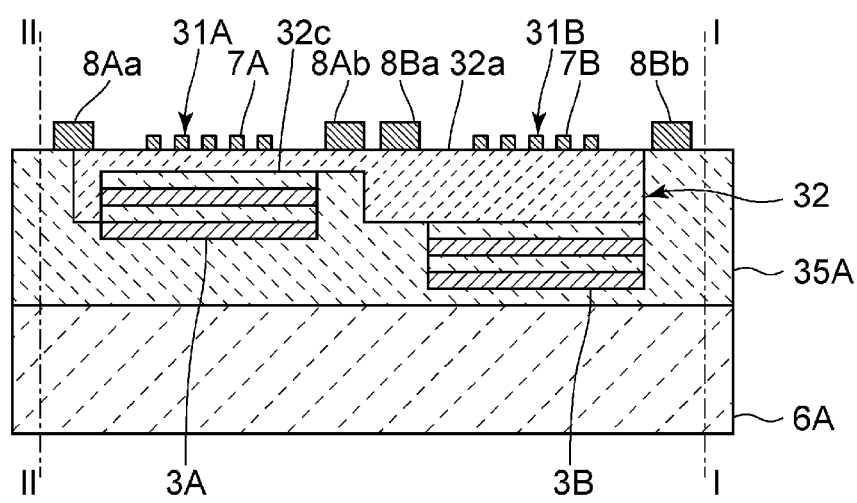

As illustrated in FIG. 9A, a mother substrate 32A made of a piezoelectric material is prepared. Next, as illustrated in FIG. 9B, first and third recesses 32Ac and 32Ae are formed in one main surface of the mother substrate 32A by, for example, reactive ion etching. At this time, the first and third recesses 32Ac and 32Ae are formed such that, in the mother substrate 32A, the thickness of portions where the third recesses 32Ae are positioned is smaller than the thickness of a portion where the first recess 32Ac is positioned.

Figure 9C:
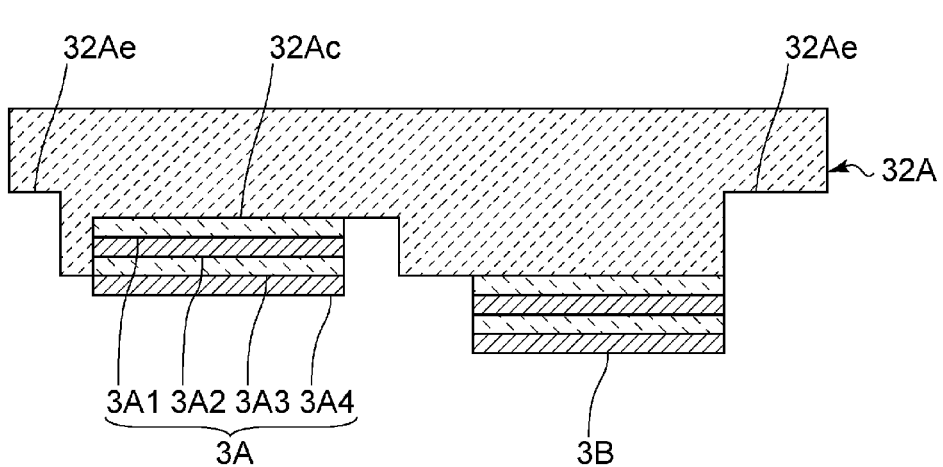

Next, as illustrated in FIG. 9C, the first and second acoustic reflection layers 3A and 3B defining and functioning the intermediate layer are formed on a side of the mother substrate 32A where the first and third recesses 32Ac and 32Ae are provided. The first acoustic reflection layer 3A is formed in the first recess 32Ac. The second acoustic reflection layer 3B is formed in a portion other than the first and third recesses 32Ac and 32Ae.

Figure 9D:
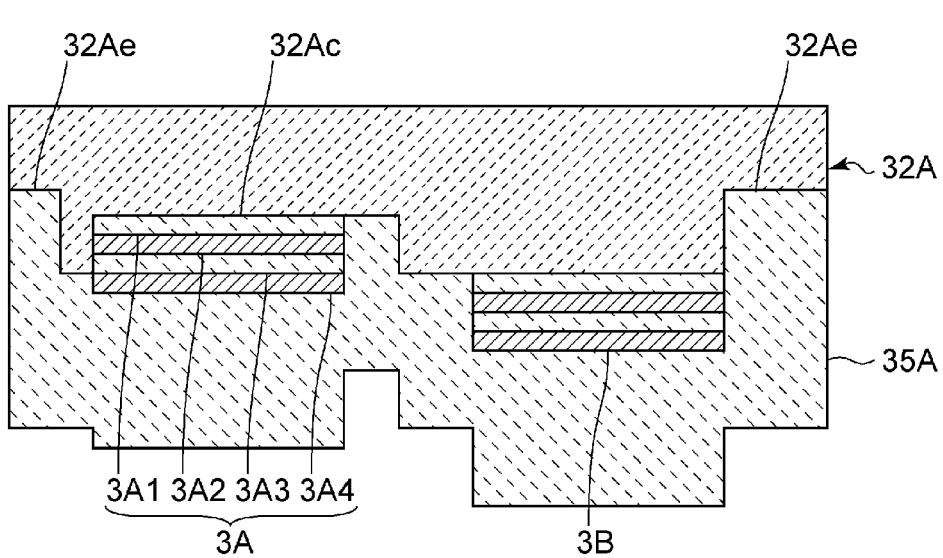

Next, a support layer 35A and the support substrate 6A are preferably provided as illustrated in FIGS. 9D and 10A by a method that is the same as or similar to the method of fabricating the acoustic wave device 10 according to the first preferred embodiment.

Next, the thickness of the mother substrate 32A is reduced. At this time, a surface of the mother substrate 32A on the opposite side to the first and second acoustic reflection layer 3A and 3B side is subjected to polishing or the like, so that the support layer 35A is exposed as illustrated in FIG. 10B. Thus, the piezoelectric thin film 32 is obtained.

Next, as illustrated in FIG. 10C, the first and second IDT electrodes 7A and 7B and wiring lines 8Ab and 8Ba are formed on a main surface 32a of the piezoelectric thin film 32. The wiring line 8Aa is formed on the main surface 32a and the support layer 35A, and the wiring line 8Bb is formed on the support layer 35A.

Also according to the present preferred embodiment, the first and second IDT electrodes 7A and 7B and the wiring lines 8Aa, 8Ab, 8Ba, and 8Bb are able to be formed on the same plane or substantially the same plane. Accordingly, the first and second acoustic wave filters 31A and 31B with different pass bands from each other are able to be easily fabricated.

Next, the resulting structure is cut along dicing lines I-I and II-II illustrated in FIG. 10C with a dicing saw. At this time, the piezoelectric thin film 32 or the first and second acoustic reflection layers 3A and 3B are not positioned on the dicing lines I-I and II-II. Thus, cutting with the dicing saw can be performed on portions of the support layer 35A where interfaces between the piezoelectric thin film 32 and the first and second acoustic reflection layers 3A and 3B or interfaces between the layers of the first and second acoustic reflection layers 3A and 3B are not positioned. Accordingly, undesirable cracks and the like are unlikely to occur in the piezoelectric thin film 32. In addition, the piezoelectric thin film 32 and the first and second acoustic reflection layers 3A and 3B are unlikely to separate from one another and the layers of the first and second acoustic reflection layers 3A and 3B are unlikely to separate from one another.

Figure 11:
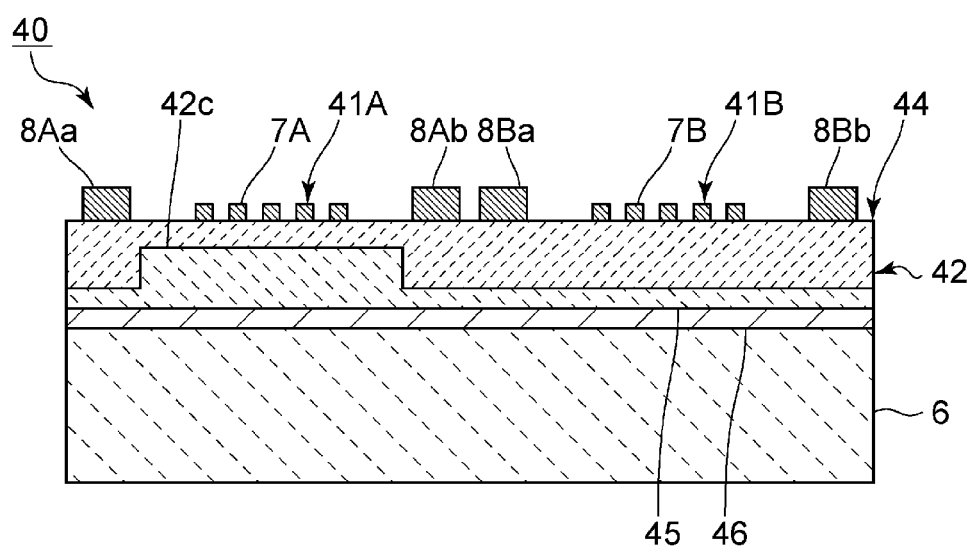
FIG. 11 is a front sectional view of an acoustic wave device according to a fourth preferred embodiment of the present invention.

FIG. 11 is a front sectional view of an acoustic wave device according to a fourth preferred embodiment of the present invention.

An acoustic wave device 40 is different from the acoustic wave device 10 according to the first preferred embodiment in the following points. That is, the intermediate layer includes a low acoustic velocity film 45 and a high acoustic velocity film 46, the acoustic wave device 40 does not include a support layer, and a piezoelectric thin film 42 does not include a second recess. Other than the above-described points, the configuration of the acoustic wave device 40 is preferably the same as or similar to that of the acoustic wave device 10 according to the first preferred embodiment. A piezoelectric laminate 44 is provided directly on the support substrate 6 in the acoustic wave device 40.

In the piezoelectric thin film 42, since a first recess 42c is provided, the thickness of the portion where the first IDT electrode 7A is provided is different from the thickness of the portion where the second IDT electrode 7B is provided. According to the present preferred embodiment, in the piezoelectric laminate 44, the thickness of a portion where the first IDT electrode 7A is provided and the thickness of a portion where the second IDT electrode 7B is provided are preferably the same. In the piezoelectric laminate 44, the thickness of the portion where the first IDT electrode 7A is provided may be different from the thickness of the portion where the second IDT electrode 7B is provided.

The low acoustic velocity film 45 is provided on a surface of the piezoelectric thin film 42 on the opposite side to the first and second IDT electrodes 7A and 7B side. The high acoustic velocity film 46 is provided on the low acoustic velocity film 45. The support substrate 6 is provided on the high acoustic velocity film 46. A support layer may be provided between the high acoustic velocity film 46 and the support substrate 6. In this case, adhering strength between the support substrate 6 and the low acoustic velocity film 45 and the high acoustic velocity film 46 which define and function as the intermediate layer can be preferably improved.

Here, an acoustic velocity at which a bulk wave propagates through the low acoustic velocity film 45 is preferably lower than an acoustic velocity at which an elastic wave propagates through the piezoelectric thin film 42. It is sufficient that the low acoustic velocity film 45 be made of a material which allows a bulk wave propagates therethrough at a comparatively low acoustic velocity. The low acoustic velocity film 45 is preferably made of, for example, a material the principal component of which is glass, silicon oxide, silicon oxynitride, tantalum oxide, or a compound made by adding fluorine, carbon, or boron to the silicon oxide.

An acoustic velocity at which the bulk wave propagates through the high acoustic velocity film 46 is higher than the acoustic velocity at which the elastic wave propagates through the piezoelectric thin film 42. It is sufficient that the high acoustic velocity film 46 be made of a material which allows a bulk wave propagates therethrough at a comparatively high acoustic velocity. The high acoustic velocity film 46 is preferably made of, for example, a material the principal component of which is aluminum nitride, aluminum oxide, silicon, silicon carbide, silicon nitride, silicon oxynitride, a diamond-like-carbon (DLC) film, or diamond.

The acoustic wave device 40, which includes the piezoelectric laminate 44 that includes the piezoelectric thin film 42, the low acoustic velocity film 45, and the high acoustic velocity film 46, is able to effectively confine energy of the elastic wave.

Also according to the present preferred embodiment, as is the case with the first preferred embodiment, first and second acoustic wave filters 41A and 41B with different pass bands from each other are able to be easily fabricated in the same chip. Furthermore, since need of an acoustic reflection layer that includes at least one low acoustic impedance sublayer and at least one high acoustic impedance sublayer is decreased, the first and second acoustic wave filters 41A and 41B are able to be easily manufactured.

Figure 12:
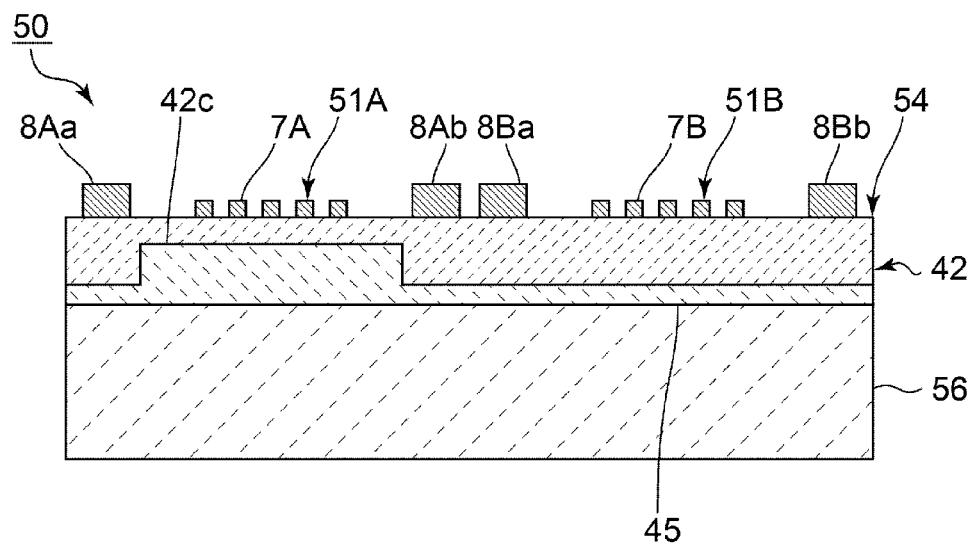
FIG. 12 is a front sectional view of an acoustic wave device according to a fifth preferred embodiment of the present invention.

FIG. 12 is a front sectional view of an acoustic wave device according to a fifth preferred embodiment of the present invention.

An acoustic wave device 50 is different from the acoustic wave device 40 according to the fourth preferred embodiment in the following points. That is, the intermediate layer includes the low acoustic velocity film 45 and the support substrate is a high acoustic velocity substrate 56. Other than the above-described points, the configuration of the acoustic wave device 50 is preferably the same as or similar to that of the acoustic wave device 40 according to the fourth preferred embodiment.

The high acoustic velocity substrate 56 is provided on the low acoustic velocity film 45. An acoustic velocity at which a bulk wave propagates through the high acoustic velocity substrate 56 is higher than an acoustic velocity at which an elastic wave propagates through the piezoelectric thin film 42. The high acoustic velocity substrate 56 is preferably made of a material that is the same as or similar to the material of the high acoustic velocity film 46 according to the fourth preferred embodiment.

Also according to the present preferred embodiment, as is the case with the fourth preferred embodiment, energy of the elastic wave is able to be effectively confined. Furthermore, first and second acoustic wave filters 51A and 51B with different pass bands from each other are able to be easily fabricated in the same chip. Furthermore, with a piezoelectric laminate 54, which includes the piezoelectric thin film 42 and the low acoustic velocity film 45, the number of laminated layers is able to be reduced. Accordingly, the first and second acoustic wave filters 51A and 51B are able to be more easily fabricated.

Furthermore, interfaces between thin films are able to be reduced in the piezoelectric laminate 54. Accordingly, separation between the thin layers due to cutting with a dicing saw is unlikely to occur during the fabricating step.

Although examples of the acoustic wave devices that include two acoustic wave filters are described according to the first to fifth preferred embodiments, a preferred embodiment of the present invention is also able to be preferably used for an acoustic wave device that includes three or more acoustic wave filters the pass bands of which are different from one another, for example.

Furthermore, although the exciting electrodes are exemplified by the IDT electrodes according to the first to five preferred embodiments, the preferred embodiments of the present invention are also able to be preferably used for a boundary acoustic wave device that includes a plurality of acoustic wave filters utilizing bulk waves, for example.

While preferred embodiments of the present invention have been described above, it is to be understood that variations and modifications will be apparent to those skilled in the art without departing from the scope and spirit of the present invention. The scope of the present invention, therefore, is to be determined solely by the following claims.

What is claimed is:

1. An acoustic wave device comprising:
   a support substrate;
   a piezoelectric laminate that includes:
      an intermediate layer provided directly or indirectly on the support substrate; and
      a piezoelectric thin film provided on the intermediate layer; and
   a first exciting electrode and a second exciting electrode provided on the piezoelectric thin film of the piezoelectric laminate so as to be disposed in an identical or substantially identical plane; wherein
   in the piezoelectric laminate, a thickness of a portion where the first exciting electrode is provided is different from a thickness of a portion where the second exciting electrode is provided;
   the intermediate layer and the IDT electrode are provided on opposite sides of the piezoelectric thin film such that the piezoelectric thin film is provided between the intermediate layer and the IDT electrode; and
   a total thickness of the intermediate layer and the piezoelectric thin film in a portion where the first exciting electrode is provided is different from a total thickness of the intermediate layer and the piezoelectric thin film in a portion where the second exciting electrode is provided.

2. The acoustic wave device according to claim 1, wherein in the piezoelectric thin film of the piezoelectric laminate, a thickness of a portion where the first exciting electrode is provided is different from a thickness of a portion where the second exciting electrode is provided.

3. The acoustic wave device according to claim 1, wherein in the intermediate layer of the piezoelectric laminate, a thickness of a portion corresponding to the first exciting electrode is different from a thickness of a portion corresponding to the second exciting electrode.

4. The acoustic wave device according to claim 1, wherein
   the intermediate layer includes a low acoustic velocity film which is provided on a surface of the piezoelectric thin film on an opposite side to a first exciting electrode side and a second exciting electrode side and through which a bulk wave propagates at a lower acoustic velocity than an acoustic velocity at which an elastic wave propagates through the piezoelectric thin film;
   the support substrate is a high acoustic velocity substrate through which the bulk wave propagates at a higher acoustic velocity than the acoustic velocity at which the elastic wave propagates through the piezoelectric thin film; and
   the support substrate is provided on the low acoustic velocity film.

5. The acoustic wave device according to claim 1, wherein the intermediate layer includes:
   a low acoustic velocity film which is provided on a surface of the piezoelectric thin film on an opposite side to a first exciting electrode side and a second exciting electrode side and through which a bulk wave propagates at a lower acoustic velocity than an acoustic velocity at which an elastic wave propagates through the piezoelectric thin film; and
   a high acoustic velocity film which is provided on the low acoustic velocity film and through which the bulk wave propagates at a higher acoustic velocity than the acoustic velocity at which the elastic wave propagates through the piezoelectric thin film.

6. The acoustic wave device according to claim 1, wherein the intermediate layer is an acoustic reflection layer that includes:
   at least one low acoustic impedance sublayer with an acoustic impedance which is comparatively low; and
   at least one high acoustic impedance sublayer with an acoustic impedance which is comparatively high.

7. The acoustic wave device according to claim 6, wherein the acoustic reflection layer includes two or more laminated sublayers.

8. The acoustic wave device according to claim 1, further comprising:
a support layer that is provided on the support substrate and that includes a portion provided between the support substrate and the intermediate layer.

9. The acoustic wave device according to claim 8, wherein the support layer surrounds the piezoelectric thin film in plan view.

10. The acoustic wave device according to claim 1, wherein the first exciting electrode and the second exciting electrode are defined by a first interdigital transducer electrode and a second interdigital transducer electrode, respectively.

11. The acoustic wave device according to claim 6, wherein there is an equal number of the at least one low acoustic impedance sublayers and the at least one high acoustic impedance sublayers.

12. The acoustic wave device according to claim 6, wherein there are fewer of the at least one low acoustic impedance sublayers and the at least one high acoustic impedance sublayers beneath the second exciting electrode than beneath the first exciting electrode.

13. The acoustic wave device according to claim 5, wherein a recess is provided in a portion of the piezoelectric thin film beneath one of the first exciting electrode and the second exciting electrode.

14. The acoustic wave device according to claim 13, wherein a portion of the low acoustic velocity film is provided within the recess.

15. The acoustic wave device according to claim 14, wherein the high acoustic velocity film has a constant or substantially constant thickness.

16. An acoustic wave device comprising:
a support substrate;
a piezoelectric laminate that includes:
an intermediate layer provided directly or indirectly on the support substrate; and
a piezoelectric thin film provided on the intermediate layer; and
a first exciting electrode and a second exciting electrode provided on the piezoelectric thin film of the piezoelectric laminate so as to be disposed in an identical or substantially identical plane; wherein
in the piezoelectric laminate, a thickness of a portion where the first exciting electrode is provided is identical or substantially identical to a thickness of a portion where the second exciting electrode is provided;
in the piezoelectric thin film, a thickness of a portion where the first exciting electrode is provided is different from a thickness of a portion where the second exciting electrode is provided;
in the intermediate layer, a thickness of a portion corresponding to the first exciting electrode is different from a thickness of a portion corresponding to the second exciting electrode;
the intermediate layer and the IDT electrode are provided on opposite sides of the piezoelectric thin film such that the piezoelectric thin film is provided between the intermediate layer and the IDT electrode; and
a total thickness of the intermediate layer and the piezoelectric thin film in a portion where the first exciting electrode is provided is different from a total thickness of the intermediate layer and the piezoelectric thin film in a portion where the second exciting electrode is provided.

17. The acoustic wave device according to claim 16, wherein
the intermediate layer is an acoustic reflection layer that includes:
at least one low acoustic impedance sublayer with an acoustic impedance which is comparatively low; and
at least one high acoustic impedance sublayer with an acoustic impedance which is comparatively high.

18. The acoustic wave device according to claim 17, wherein there is an equal number of the at least one low acoustic impedance sublayers and the at least one high acoustic impedance sublayers.

19. The acoustic wave device according to claim 17, wherein there are fewer of the at least one low acoustic impedance sublayers and the at least one high acoustic impedance sublayers beneath the second exciting electrode than beneath the first exciting electrode.

20. The acoustic wave device according to claim 16, wherein a recess is provided in a portion of the piezoelectric thin film beneath one of the first exciting electrode and the second exciting electrode.

* * * * *